US011671764B2

(12) United States Patent
Pedersen et al.

(10) Patent No.: US 11,671,764 B2
(45) Date of Patent: Jun. 6, 2023

(54) CAN THICKNESS AND MATERIAL COMBINATIONS FOR IMPROVED RADIO-FREQUENCY MICROPHONE PERFORMANCE

(71) Applicant: Knowles Electronics, LLC, Itasca, IL (US)

(72) Inventors: Michael Pedersen, Long Grove, IL (US); Joshua Watson, Wheaton, IL (US); Adam Ariffin, Naperville, IL (US); Daniel J. Fairfield, Elmhurst, IL (US)

(73) Assignee: Knowles Electronics, LLC, Itasca, IL (US)

( * ) Notice: Subject to any disclaimer, the term of this patent is extended or adjusted under 35 U.S.C. 154(b) by 173 days.

(21) Appl. No.: 17/126,910

(22) Filed: Dec. 18, 2020

(65) Prior Publication Data

US 2021/0204070 A1 Jul. 1, 2021

Related U.S. Application Data

(60) Provisional application No. 62/955,378, filed on Dec. 30, 2019.

(51) Int. Cl.
*H04R 19/04* (2006.01)
*H04R 1/08* (2006.01)
*H04R 1/04* (2006.01)

(52) U.S. Cl.
CPC .............. *H04R 19/04* (2013.01); *H04R 1/04* (2013.01); *H04R 1/083* (2013.01); *H04R 2201/003* (2013.01)

(58) Field of Classification Search
CPC .......... H04R 19/04; H04R 1/04; H04R 1/083; H04R 2201/003; B81B 7/0064;
(Continued)

(56) References Cited

U.S. PATENT DOCUMENTS 5,579,398 A 11/1996 Ewens
6,307,944 B1 10/2001 Garratt
(Continued)

FOREIGN PATENT DOCUMENTS

| CN | 205596345 | 9/2016 | |
|---|---|---|---|
| WO | WO-2019133644 A1 * | 7/2019 | ........... H04R 19/005 |
| WO | 2020206628 | 10/2020 | |

OTHER PUBLICATIONS

Watson, U.S. Appl. No. 17/126,733, U.S. Patent and Trademark Office, filed Dec. 18, 2020.

*Primary Examiner* — Angelica M McKinney
(74) *Attorney, Agent, or Firm* — Loppnow & Chapa; Matthew C. Loppnow

(57) ABSTRACT

A microphone assembly includes a substrate, an acoustic transducer, an integrated circuit, and a cover couples to the substrate to enclose a back volume of the microphone assembly in which the acoustic transducer and the integrated circuit are disposed. The acoustic transducer includes a back plate and a diaphragm oriented parallel to the back plate disposed over an aperture in the substrate to receive acoustic signals. The cover is a metallic material with a thickness and a corresponding thermal diffusivity to attenuate incoming radio-frequency signals. The attenuation of the radio-frequency signals prevents ambient noise detectable by the microphone assembly.

17 Claims, 4 Drawing Sheets

(58) Field of Classification Search
CPC ...... B81B 2201/0257; B81B 2207/012; B81C 2203/0109
See application file for complete search history.

(56) References Cited

U.S. PATENT DOCUMENTS

| | | |
|---|---|---|
| 6,781,231 B2 | 8/2004 | Minervini |
| 7,166,910 B2 | 1/2007 | Minervini |
| 7,706,559 B2 | 4/2010 | Collins |
| 8,682,015 B2 | 3/2014 | Miller |
| 9,554,214 B2 | 1/2017 | Nielsen |
| 11,279,611 B2* | 3/2022 | Cheng ................ B81C 1/00968 |
| 2004/0207074 A1* | 10/2004 | MacDonald ............. C23F 4/00 257/708 |
| 2005/0213787 A1 | 9/2005 | Collins |
| 2007/0215962 A1 | 9/2007 | Minervini |
| 2014/0037124 A1* | 2/2014 | Lim ........................ H04R 1/02 361/748 |
| 2015/0172825 A1 | 6/2015 | Lim |
| 2017/0325013 A1* | 11/2017 | Dehe ........................ H04R 1/04 |
| 2019/0270637 A1* | 9/2019 | Fueldner ............... B81B 7/0058 |

\* cited by examiner

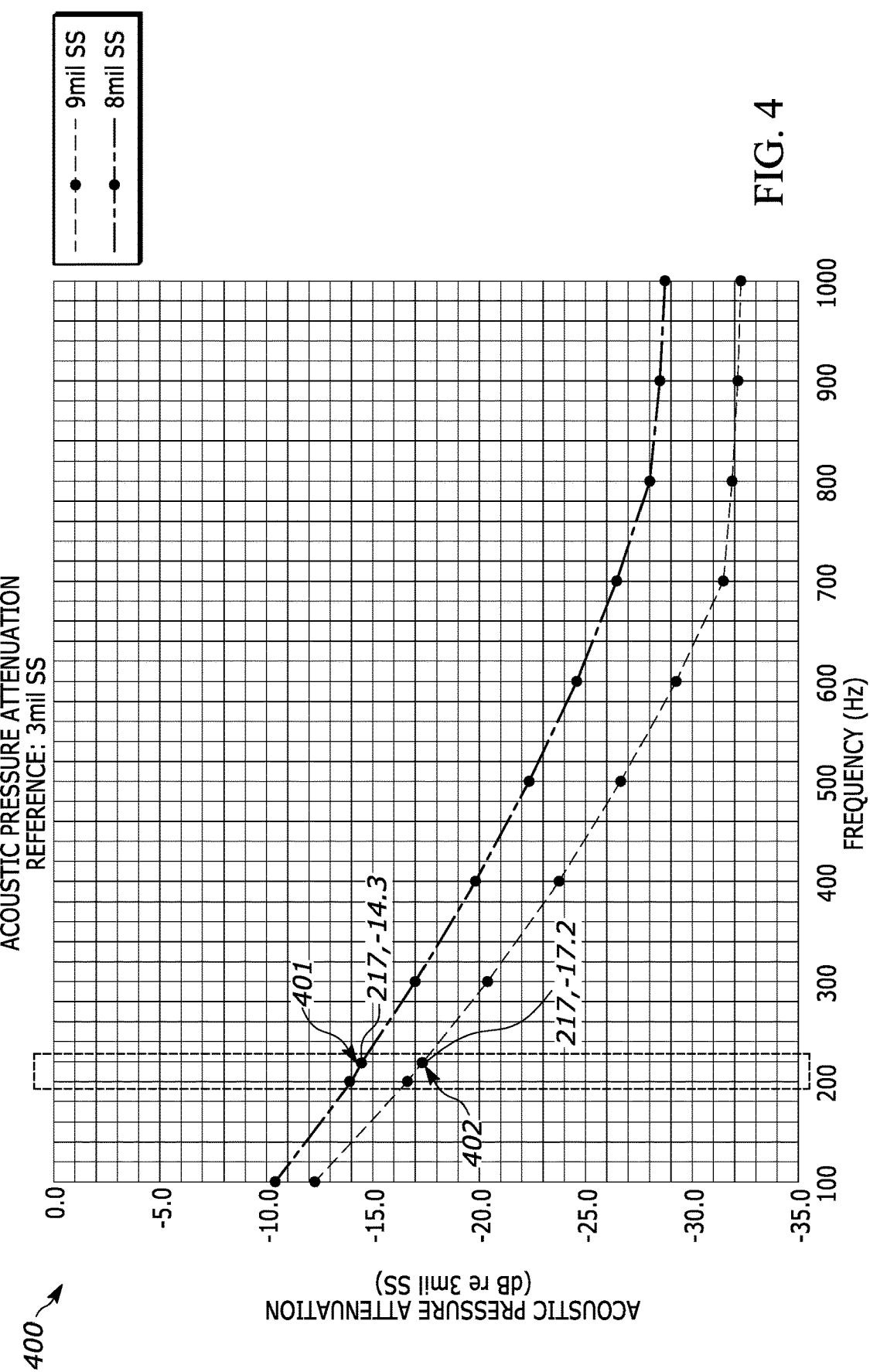

CAN THICKNESS AND MATERIAL COMBINATIONS FOR IMPROVED RADIO-FREQUENCY MICROPHONE PERFORMANCE

CROSS-REFERENCE TO RELATED APPLICATIONS

The present application claims the priority benefit of U.S. Provisional Patent Application No. 62/955,378, filed Dec. 30, 2019, which is incorporated herein by reference.

FIELD OF THE DISCLOSURE

The present disclosure relates to microelectromechanical systems (MEMS) sensors, and in particular, to MEMS sensors having improved noise performance and components therefor.

BACKGROUND

Microphone assemblies that include microelectromechanical systems (MEMS) acoustic transducers convert acoustic energy into an electrical signal. The microphone assemblies may be employed in mobile communication devices, laptop computers, and appliances, among other devices and machinery in Radio Frequency (RF) signal environments. MEMS and other sensitive sensors, like microphone assemblies having a metal can or cover are susceptible to interference from radio frequency (RF) radiation. RF induced temperature increases within the microphone housing generally raise the ambient noise level. Additionally, intermittent RF signals may produce intermittent thermal fluctuations and corresponding pressure variations detectable by the transducer. Such pressure variations may result in audible artifacts in the transducer output if the modulation frequency is within the audible band.

In previous attempts at a solution, the effect has been offset by disposing a can liner made from liquid crystal polymer, polytetrafluoroethylene, or similar material on the inside surface of the can of standard thickness (3 mil). The liner would typically have a lower thermal diffusivity in an attempt to diffuse the heat from the surface currents at the exposed modulation frequency and lower the temperature of the back volume.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

FIG. 4 is a graph illustrating acoustic pressure attenuation versus frequency at various can thicknesses, according to the embodiment of FIG. 1.

DETAILED DESCRIPTION

Figure 1:
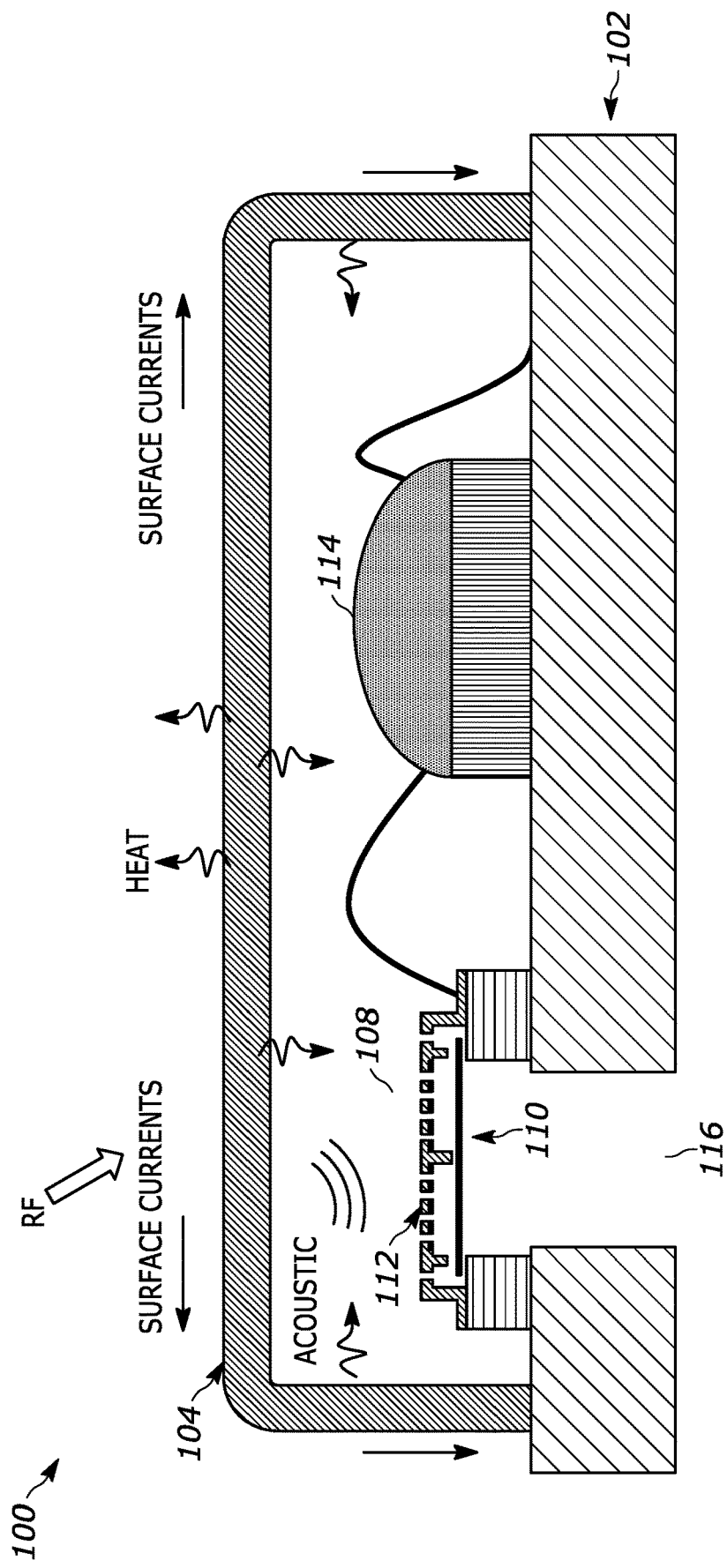
FIG. 1 is a schematic diagram of a MEMS microphone assembly having an increased can thickness.

In general, disclosed herein is a microphone assembly having reduced susceptibility to radio frequency (RF) signal induced noise and audible artifacts. The microphone assembly generally comprises a MEMS transducer and an integrated circuit disposed in an internal volume of a housing having a sound port and an electrical interface suitable for integration with a host device (e.g., using surface mounting technology). In one implementation, the housing comprises a can disposed on a substrate or base, the combination of which forms an internal volume in which the transducer and integrated circuit are disposed. The MEMS transducer may be a capacitive, piezoelectric or other transduction device configured to convert acoustic energy into an electrical signal. The MEMS transducer is coupled to the integrated circuit and the integrated circuit is coupled to contacts on the electrical interface. The integrated circuit is capable of receiving and conditioning the electrical signal produced by the transducer. Such signal conditioning may include buffering, filtering, amplification, A/D conversion, protocol interface conversion, among other signal conditioning or processing. The integrated circuit may be an application-specific integrated circuit (ASIC). In some embodiments, the MEMS transducer is coupled to and positioned proximate a sound port formed in the substrate. In other embodiments, the transducer is coupled to and located proximate a sound port disposed in the can or cover portion of the housing.

According to the embodiments described herein, the microphone assembly includes a substrate, a microelectromechanical (MEMS) acoustic transducer, an integrated circuit, and a cover. The MEMS acoustic transducer is configured to generate an electrical signal in response to sensed acoustic activity. The integrated circuit is configured to generate an output signal representative of the sensed acoustic activity based on the electrical signal. The cover is coupled to the substrate to enclose a volume between the cover and the substrate in which the MEMS acoustic transducer and the integrated circuit are disposed. The cover is formed of a single continuous material having a thickness within a range between approximately 6 mil and 12 mil. Cans thicknesses greater than 12 mil may be used but formation of the can (e.g., in a drawing process) may be complicated due to excessive can thickness. The cover material has a thermal diffusivity in a range between $2e^{-6}$ and $5e^{-6}$ m$^2$/s. Materials having a higher thermal diffusivity may be suitable for thicker cans, whereas thinner cans will generally require a lower thermal diffusivity. The cover material can be stainless steel, a titanium alloy, or an Inconel alloy, or a combination of the three to achieve the desired thermal diffusivity. Other materials, metals or alloys may be alternatively used.

The embodiments disclosed herein can simplify the overall fabrication of components for and assembly of microphone assemblies, for example, by eliminating the need for a liner. The microphone assemblies disclosed herein have improved immunity to RF induced noise without the need for a can liner. The can will have suitable heat or thermal diffusion time properties if the can thickness and diffusivity are in the ranges described above.

The trend in the market of integrated circuits and microelectronic devices has been to scale down in size while maintaining equal or greater processing ability. As fabrication increases in difficulty as size decreases, new solutions to simplify device fabrication are required. However, it is counterintuitive to scale up the can thickness to simplify fabrication. Insufficient can thickness may not provide adequate noise attenuation. Excessive can thickness can cause an increase in package size, complicate can drawing or formation, and result in lowered production rates. During production, a plurality of microphone assemblies are typically fabricated on a single substrate comprising an array of printed circuit boards (PCBs), each of which forms a corresponding one of the plurality of microphone assemblies; an increase in microphone package size would result in a decrease in packages per PCB substrate due to the enlarged size. Conversely, it is also possible to scale the can thickness inwards, towards the back volume, keeping the outer can dimensions unchanged. In this the case, there is also a limit to scaling as the associated reduction in back volume results in increased thermo-acoustic boundary layer noise.

Among other benefits, a microphone package with increased can thickness in the range of 6 mil to 12 mil can maintain the same dimensions, heat dissipation, and signal attenuation as would a package with a can and liner combination, albeit with decreased design complexity, fabrication complexity, and fabrication cost. The details of the general depiction provided above will be more fully explained by reference to FIGS. 1-4.

In FIG. 1, a microphone assembly 100 comprises a substrate 102, a can (also referred to as a cover or lid) 104 coupled to the substrate 102 to form a housing, with an enclosed space (back volume), in which an acoustic transducer 108 and an integrated circuit 114 are located. In FIG. 1, the acoustic transducer includes a diaphragm and 110 and a back plate 112 wherein the diaphragm is oriented parallel to the back plate and is configured to move with respect to the back plate in response to variations in pressure received through a port 116. Alternatively, the transducer could be mounted on the can instead of the base as described herein. In other implementations, the transducer is a piezoelectric or optical device. The acoustic transducer 108 can generate an electrical signal detectable by the integrated circuit 114 in response to the movement of the diaphragm. The integrated circuit 114 can be coupled to the acoustic transducer 108 and be programmed to receive and process the electrical signal generated by the acoustic transducer 108. The integrated circuit 114 may be an application-specific integrated circuit (ASIC) or other type of programmable system on a chip. The acoustic transducer 108 and the integrated circuit 114 can be fabricated on the same substrate, or can be fabricated separately and mounted on the substrate. The can 104 is made of a single continuous metallic material that acts as a Faraday cage for the microphone assembly.

The main factors of any MEMS microphone assembly that affects the ability of the microphone assembly to prevent localized heating of the can by a modulated RF signal are the thermal properties of the can. In the case of the prior art can and liner combination as seen in FIG. 1, the liner thickness for a particular can size and can thickness must be optimized according to the following thermo-acoustic relationship:

$$t_{liner} \cong 0.11 \sqrt{\frac{k}{\rho c_p}}$$

where $t_{liner}$ is the thickness of the can and the ratio $k/(\rho c_p)$ is the thermal diffusivity of the substance. This is further described in FIG. 2.

Figure 2:
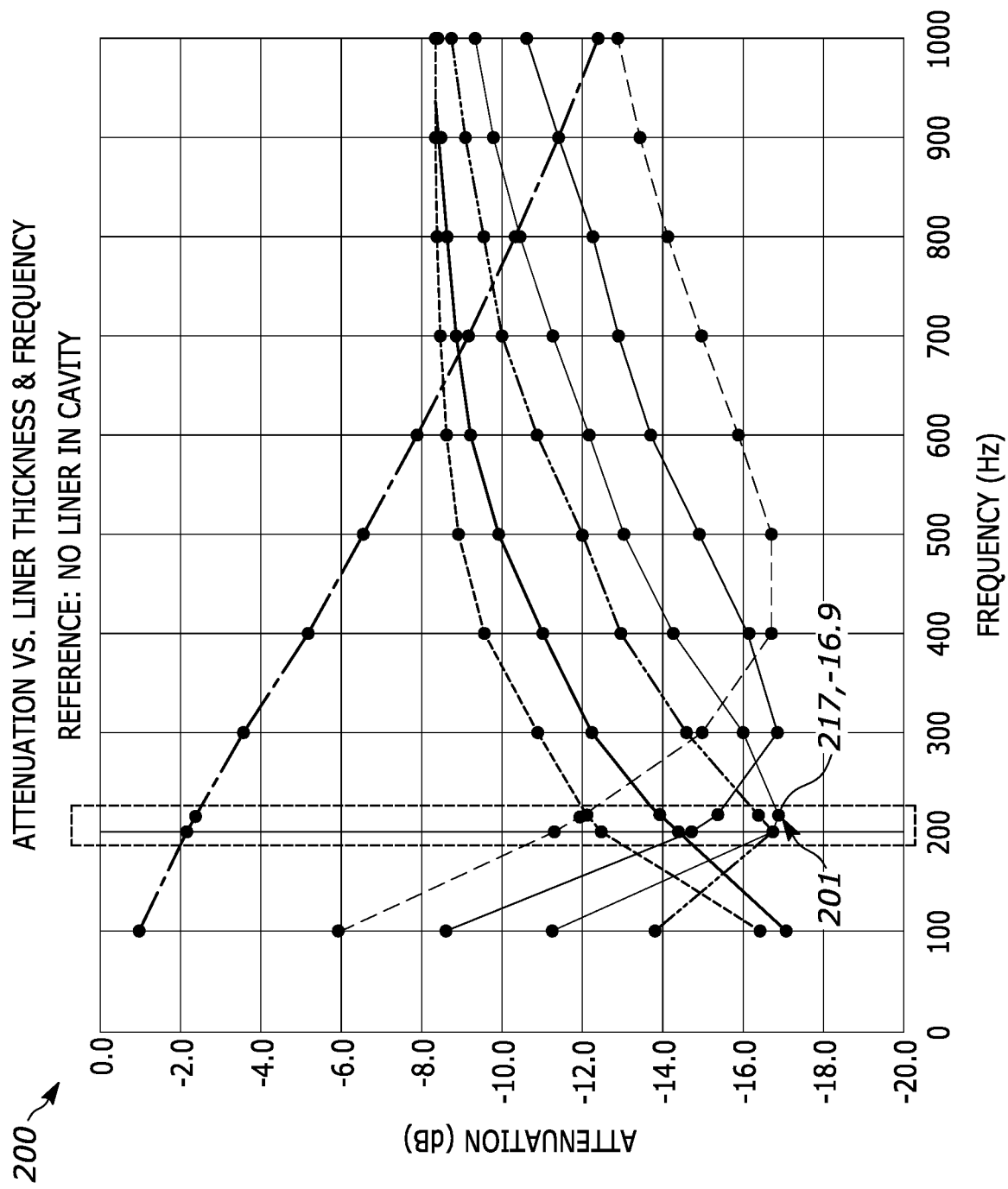
FIG. 2 is a graph illustrating acoustic pressure attenuation versus frequency at various liner thicknesses, according to a prior art embodiment.

FIG. 2 depicts a graph 200 illustrating attenuation versus frequency at a standard can thickness of 3 mil paired with various liner thicknesses according to the prior art can and liner combination. The multiple data sets shown are sequences of acoustic pressure in the back volume of microphone assemblies with cans paired with various PTFE liner thicknesses that have been normalized according to reference data from a can without a liner. The graph shows at a point 201 that optimum attenuation (i.e., attenuation at 217 Hz) in decibels (dB) of the can-liner combination is achieved at a PTFE liner thickness of approximately 35 um, resulting in an attenuation of −16.9 dB. The liner has thermal properties that effectively alter the properties of the can, namely its thermal diffusivity. This results in attenuation of acoustic waves generated due to localized heating from RF induced surface currents.

However, the inventor has determined that the same relationship between liner thickness and thermal diffusivity can be applied to the total thickness of the can devoid of a liner with nearly the same results. As the optimized thickness scales with the square root of the thermal diffusivity, an almost identical effect as combining a liner and a can may be achieved with a metallic material having a thermal diffusivity in the range $2e^{-6}$ and $5e^{-6}$ m$^2$/s. This range of thermal diffusivity reduces localized heating capable of generating detectable audio artifacts and provides the ability to have a sufficiently thin can to maintain the same standard dimensions as the can-liner combination MEMS microphone assemblies. Further, to achieve optimum attenuation, the thickness of the can must be increased according to the same thermo-acoustic relationship dependent upon its thermal diffusivity.

Figure 3:
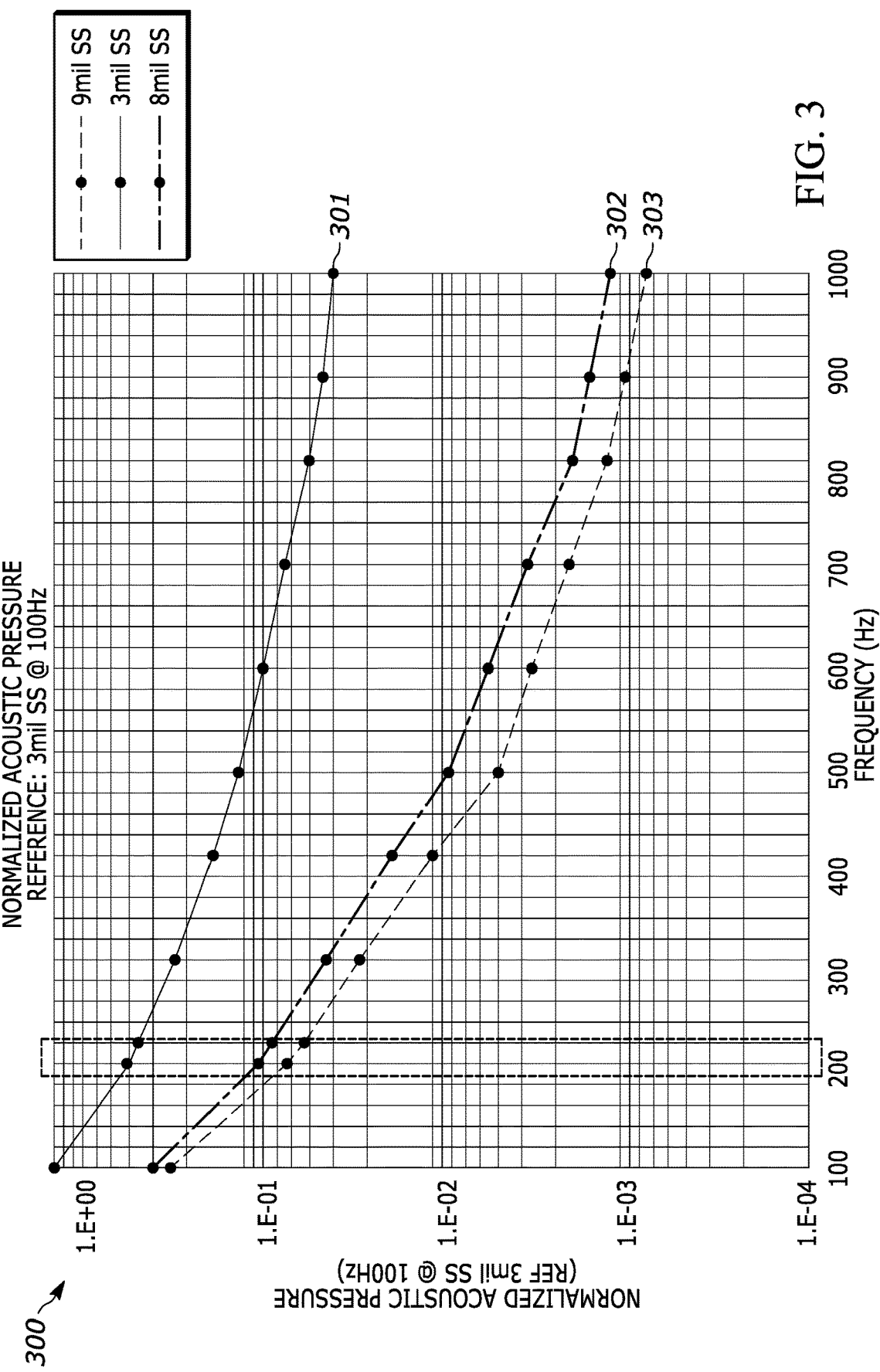
FIG. 3 is a graph illustrating normalized acoustic pressure versus frequency in a MEMS microphone assembly according to the embodiment of FIG. 1 at various can thicknesses.

FIG. 3 depicts a graph 300 illustrating normalized acoustic pressure versus RF modulation frequency of a microphone assembly of various can thicknesses according to some embodiments. Data series 301 corresponds to a microphone assembly with a standard can size of 3 mil, and data series 302 and 303 correspond to microphone assemblies with substantially increased can thickness. The effect of the increased can thickness at data series 302 and 303 can be seen with respect to reference data series 301. The normalized acoustic pressure is attenuated roughly one order of magnitude with an increased can thickness of approximately 9 mil, which is easily achievable in fabrication.

The can material can be any material with a thermal diffusivity in the range $2e^{-6}$ and $5e^{-6}$ m$^2$/s with metallic properties to act as an electric shield for the microphone. The can material can include stainless steel, a titanium alloy, a super alloy such as an Inconel alloy, or another metallic alloy of similar properties. The can may have a thickness within the range 6 mil to 12 mil such that a desired amount of attenuation is achieved to prevent noise being generated from localized heating of the can.

FIG. 4 depicts a graph 500 of normalized acoustic pressure for stainless steel cans with thicknesses of 8 mil and 9 mil according to some embodiments. At 217 Hz, a point 401 shows attenuation of an 8 mil thick stainless steel can is −14.3 dB. At the same frequency, a point 402 shows attenuation of a 9 mil thick stainless steel can is −17.2 dB. A thick stainless steel can or cover demonstrates superior attenuation properties compared to the can-liner combination assembly, and proves the equation above can be applied to a thickness of the can with the proper thermo-acoustic properties with superior results.

According to the embodiments described herein, the microphone assembly includes a substrate, a microelectro-mechanical (MEMS) acoustic transducer, an integrated circuit, and a cover. The MEMS acoustic transducer is configured to generate an electrical signal in response to sensed acoustic activity. The integrated circuit is configured to generate an output signal representative of the sense acoustic activity based on the electrical signal. The microphone assembly includes a cover coupled to the substrate that encloses a volume between the cover and the substrate in which the MEMS acoustic transducer and the integrated circuit are disposed. The cover is formed of a material having a thermal diffusivity in a range between $2e^{-6}$ and $5e^{-6}$ m²/s. The material can be stainless steel, a titanium alloy, or an Inconel alloy. The cover is devoid of a liner.

According to the embodiments described herein, a metal can devoid of a liner for a microphone assembly includes a closed-ended side wall with an open end configured to be soldered to a base having a surface mountable electrical interface; an end portion coupled to another end of the close-ended side wall, opposite the open end; and the metal can formed of a material having a thermal diffusivity within a range between $2e^{-6}$ and $5e^{-6}$ m²/s. The closed-ended side wall and the end portion constitute an unassembled unitary member. The metal can has a thickness within a range between 6 mil and 12 mil. The material can be a titanium alloy, an Inconel alloy, or stainless steel.

According to the embodiments described herein, a microphone assembly includes a housing having a sound port, the housing including a cover mounted on a base having a surface mountable external-device interface, the cover devoid of a liner and having a thermal diffusivity within a range between $2e^{-6}$ and $5e^{-6}$ m²/s. The microphone assembly further includes a MEMS transducer disposed in the housing and configured to generate an electrical signal in response to acoustic activity sensed by the transducer. The microphone assembly further includes an integrated circuit disposed in the housing, the integrated circuit coupled to an output of the transducer and to contacts of the external-device interface. The integrated circuit is configured to generate, based on the electrical signal, an output signal representative of the sensed acoustic activity. The cover has a thickness within a range between 6 mil and 12 mil. The cover is a drawn metal sheet material. The cover cane be a titanium alloy, an Inconel alloy, or stainless steel.

According to the embodiments described herein, superior attenuation at an incoming signal frequency is achievable with a simpler solution than previously thought possible, allowing for decreased fabrication costs, fabrication complexity, and production time spent. The proposed solution eliminates the need for any synthetic liner materials, bonding agents, fabrication complexity, and man-hours required to produce a combination can. Furthermore, the proposed solution decreases production costs by choosing a single continuous metallic can material of proper thermal diffusivity and thickness while maintaining the current microphone assembly footprint, thereby ensuring unaffected production rates based on the number of assemblies per wafer produced.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc."

is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly, comprising:
   a substrate;
   a microelectromechanical systems (MEMS) acoustic transducer configured to generate an electrical signal in response to sensed acoustic activity;
   an integrated circuit configured to generate, based on the electrical signal, an output signal representative of the sensed acoustic activity; and
   a cover coupled to the substrate and enclosing a volume between the cover and the substrate in which the MEMS acoustic transducer and the integrated circuit are disposed, the cover formed of a material having a thickness within a range between 8 mil and 12 mil, wherein the material has a thermal diffusivity in a range between $2e^{-6}$ and $5e^{-6}$ m$^2$/s.

2. The microphone assembly of claim 1, wherein the material is stainless steel.

3. The microphone assembly of claim 1, wherein the material is a titanium alloy.

4. The microphone assembly of claim 1, wherein the material is an Inconel alloy.

5. The microphone assembly of claim 1, wherein the cover is devoid of a liner.

6. A metal can devoid of a liner for a microphone assembly, the metal can comprising:
   a closed-ended side wall with an open end configured to be soldered to a base having a surface mountable electrical interface;
   an end portion coupled to another end of the close-ended side wall, opposite the open end, wherein the closed-ended side wall and the end portion constitute an unassembled unitary member; and
   the metal can formed of a material having a thermal diffusivity within a range between $2e^{-6}$ and $5e^{-6}$ m$^2$/s.

7. The metal can of claim 6, wherein the can has a thickness within a range between 6 mil and 12 mil.

8. The metal can of any of claim 6 or 7, wherein the material is a titanium alloy.

9. The metal can of any of claim 6 or 7, wherein the material is an Inconel alloy.

10. The metal can of any of claim 6 or 7, wherein the material is stainless steel.

11. The metal can of any of claim 6 or 7 in combination with a microelectromechanical systems (MEMS) transducer coupled to an integrated circuit, the MEMS transducer and the integrated circuit disposed in a housing formed by the metal can mounted on the base having a surface mountable electrical interface with contacts electrically coupled to the integrated circuit.

12. A microphone assembly comprising:
    a housing having a sound port, the housing including a cover mounted on a base having a surface mountable external-device interface,
    the cover devoid of a liner, the cover having a thermal diffusivity within a range between $2e^{-6}$ and $5e^{-6}$ m$^2$/s;
    a microelectromechanical systems (MEMS) transducer disposed in the housing and configured to generate an electrical signal in response to acoustic activity sensed by the transducer;
    an integrated circuit disposed in the housing, the integrated circuit coupled to an output of the transducer and to contacts of the external-device interface, the integrated circuit configured to generate, based on the electrical signal, an output signal representative of the sensed acoustic activity.

13. The assembly of claim 12, wherein the cover has a thickness within a range between 6 mil and 12 mil.

14. The assembly of claim 13, wherein the cover is a drawn metal sheet material.

15. The assembly of claim 12, wherein the cover is a titanium alloy.

16. The assembly of claim 12, wherein the cover is an Inconel alloy.

17. The assembly of claim 12, wherein the cover is stainless steel.

* * * * *